(12) United States Patent
Gomez et al.

(10) Patent No.: US 7,531,229 B2
(45) Date of Patent: May 12, 2009

(54) MICROSTRUCTURED COMPONENT AND METHOD FOR ITS MANUFACTURE

(75) Inventors: Udo-Martin Gomez, Leonberg (DE); Franz Laermer, Weil Der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/618,795

(22) Filed: Jul. 14, 2003

(65) Prior Publication Data
US 2004/0081809 A1 Apr. 29, 2004

(30) Foreign Application Priority Data
Jul. 13, 2002 (DE) ................... 102 31 730

(51) Int. Cl.
| | |
|---|---|
| *B32B 3/02* | (2006.01) |
| *B60T 8/60* | (2006.01) |
| *B60T 8/74* | (2006.01) |
| *H01L 23/15* | (2006.01) |
| *G01P 15/00* | (2006.01) |

(52) U.S. Cl. ................... 428/76; 73/504.02; 73/514.35; 180/170; 188/181 A; 257/687; 257/704; 303/146

(58) Field of Classification Search ............ 428/68, 428/76, 172; 257/691, 704, 724, 687; 303/119.3, 303/146; 73/49.3, 52, 204, 22, 504.02, 504.12, 73/514.35, 514.39; 340/438; 180/170; 188/180, 188/181 A
See application file for complete search history.

(56) References Cited
U.S. PATENT DOCUMENTS

| | | | | |
|---|---|---|---|---|
| 5,831,162 A | * | 11/1998 | Sparks et al. | 73/504.12 |
| 6,062,461 A | * | 5/2000 | Sparks et al. | 228/123.1 |
| 6,078,103 A | * | 6/2000 | Turner | 257/734 |
| 6,441,481 B1 | * | 8/2002 | Karpman | 257/711 |
| 6,686,642 B2 | * | 2/2004 | Regan et al. | 257/521 |
| 6,761,420 B2 | * | 7/2004 | Maluf et al. | 303/119.2 |

* cited by examiner

*Primary Examiner*—Donald Loney
(74) *Attorney, Agent, or Firm*—Kenyon & Kenyon LLP

(57) ABSTRACT

A microstructured component having a layered construction may allow implementation of component structures having a layer thickness of more than 50 μm, e.g., more than 100 μm. Capping of the component structure may allow vacuum enclosure of the component structure with a hermetically sealed electrical connection. The layered construction of the microstructured component includes a carrier including at least one glass layer, e.g., a PYREX™ layer, a component structure, arranged in a silicon layer, which is bonded to the glass layer, and a cap, which is positioned over the component structure and is also bonded to the glass layer.

7 Claims, 5 Drawing Sheets

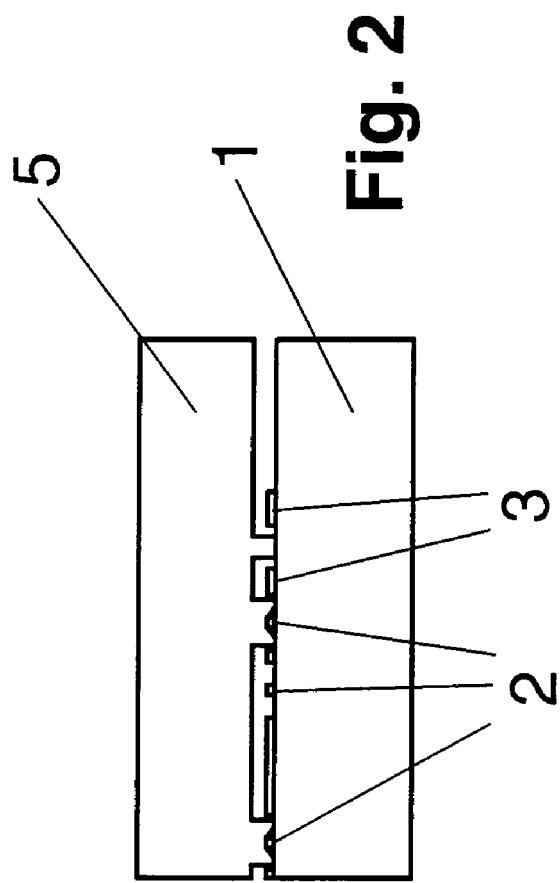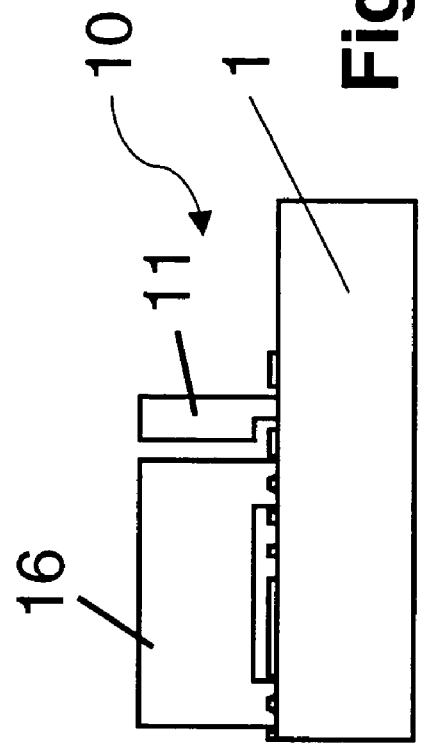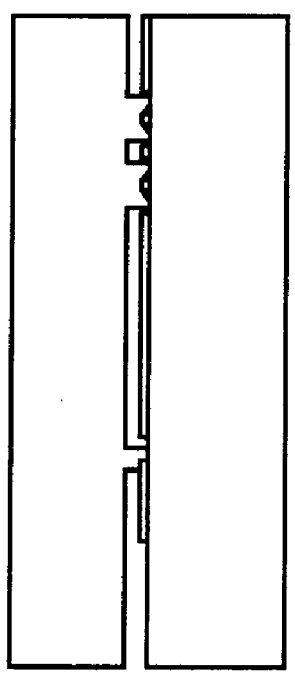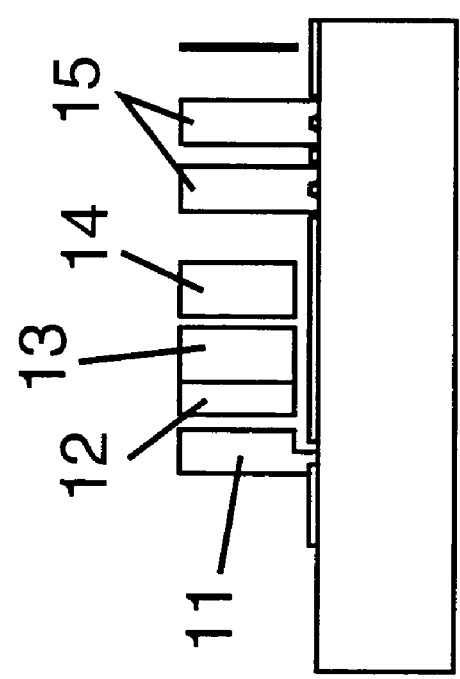

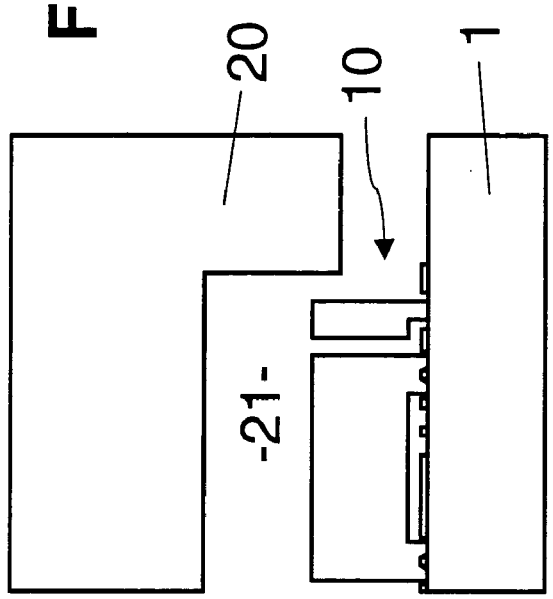
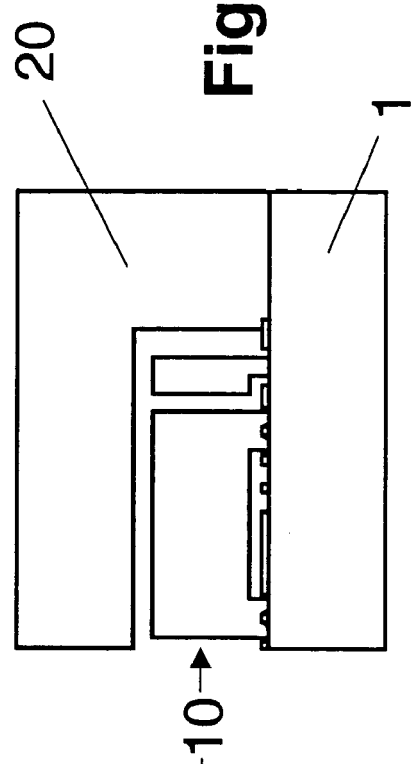
Fig. 4
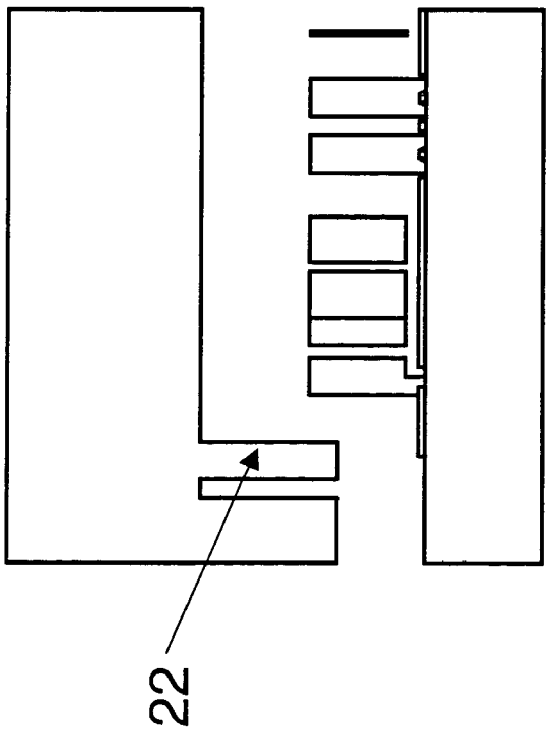
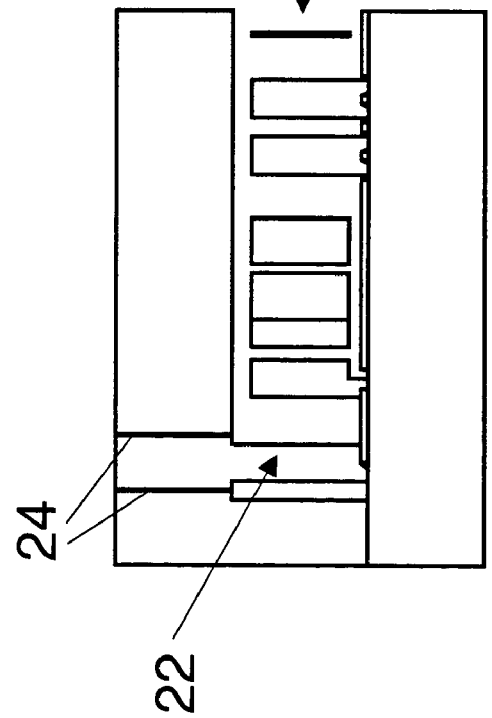
Fig. 5

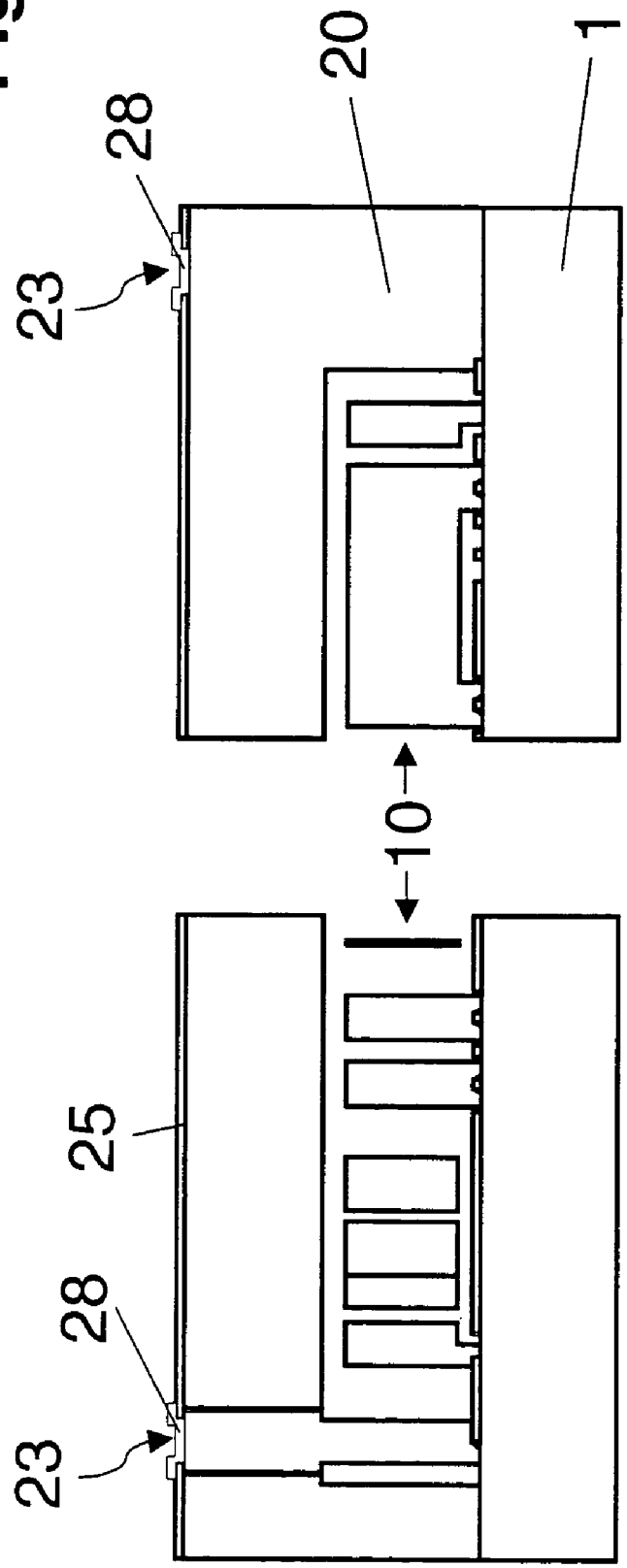

MICROSTRUCTURED COMPONENT AND METHOD FOR ITS MANUFACTURE

CROSS-REFERENCE TO RELATED APPLICATIONS

The present application claims priority to Application No. 102 31 730.5, filed in the Federal Republic of Germany on Jul. 13, 2002, which is expressly incorporated herein in its entirety by reference thereto.

FIELD OF THE INVENTION

The present invention relates to a microstructured component having a layered construction, which includes a carrier including at least one glass layer, e.g., a PYREX™ layer, and a component structure, arranged in a silicon layer, which is bonded to the glass layer. Furthermore, the present invention relates to a method of manufacturing such a microstructured component.

BACKGROUND INFORMATION

Greatly varying microstructured components having a silicon-on-PYREX™ layered construction, in which the component structure is arranged in the silicon layer, are conventional. The silicon layer is typically formed as a silicon wafer which is bonded to the PYREX™ layer. For this purpose, the silicon layer and/or its layer thickness is first defined by introducing a high boron doping in the surface of the silicon wafer. Subsequently, the sensor structure is etched in the silicon wafer starting from the surface to be bonded to the PYREX™ layer. After the silicon wafer has been bonded to the PYREX™ layer, the entire silicon wafer is dissolved up to the $p^+$ etch stop on the highly boron-doped layer. In this manner, component structures having a maximum layer height of approximately 20 µm may be produced.

Using the technique described above, micromechanical components including deflectable structure elements are manufactured, such as sensor elements for acceleration and angular rate sensors. In addition to the harmful parasitic capacitances of the sensor contacts, the basic capacitance of the sensor and the mode interval of in-plane and out-of-plane modes, which are both a function of the height of the component structure, are decisive for the performance of such micromechanical components. Furthermore, the performance is influenced by the oscillation quality, which is implicitly a function of the quality of the vacuum enclosure of the component structure.

SUMMARY

An example embodiment of the present invention may provide for a microstructured component having a layered construction which may allow the implementation of component structures having a layer thickness of more than 50 µm and even more than 100 µm. In this manner, micromechanical components may be produced which have both a high basic capacitance and a large in-plane to out-of-plane mode interval. An example embodiment of the present invention may also provide capping of the component structure, which may allow vacuum enclosure of the component structure with a hermetically sealed electrical connection.

An example embodiment of the present invention may provide for a special layered construction of the microstructured component according to the present invention. This includes, besides the carrier including the glass layer and the component structure arranged in a silicon layer, which is bonded to the glass layer, a cap, which is positioned over the component structure and is also bonded to the glass layer. According to an example embodiment of the present invention, the component structure is produced in a first silicon wafer after it has been bonded to the glass layer. In addition, the glass layer of the carrier is used both for fixing the component structure and for attaching the cap.

In principle, there are various possibilities for implementing the microstructured component according to the present invention.

A (111)-silicon wafer may be provided as the first silicon wafer, since in this case homogeneous isotropic mechanical properties may be guaranteed within the component structure plane, e.g., a homogeneous isotropic module of elasticity, so that even a ring gyro may be arranged in the component structure, for example.

The first silicon wafer may be bonded to the glass layer through anodic bonding, since a tight bond arises during the bonding process between the silicon and the glass layer and possibly also between the silicon and a metallization which is integrated into the layered construction. The metallization is typically arranged on the glass layer. Due to the high contact pressure and the high temperatures of approximately 400° C., a eutectic mixture may form during the bonding process with most possible silicon-metal combinations. An ohmic contact may arise between the silicon and the metal which may greatly exceed the electrical conductivity and reliability of a simple pressure contact.

The first silicon wafer is pre-structured before bonding on its bonding side in such a manner that the bonding areas, i.e., the bonding points on the glass layer, project, while the parts of the bond-side surface which are not to come in contact with the glass layer are set back in relation to it. Alternatively or additionally to the pre-structuring of the first silicon wafer, the glass layer may also be structured in a suitable manner. After the bonding, the first silicon wafer is then structured starting from the diametrically opposing surface, by using silicon trench technology, for example, the entire component structure able to be produced having a relatively large structure height. Due to the pre-structuring of the silicon wafer and/or the glass layer, freely movable structures may be implemented directly in this case.

In an example embodiment of the microstructured component according to the present invention, the cap is also arranged in a silicon wafer and bonded to the glass layer through anodic bonding. For this purpose, a second silicon wafer is pre-structured through trench etching, for example, so that it includes depressions and/or cavities corresponding to the height of the component structure to be capped. The depth of the depressions may be greater than the layer thickness of the component structure, and enough that deflection of the movable parts of the component structure may occur to a preset extent. In an example embodiment, the cap forms an overload protector, i.e., a stop, for the deflectable elements of the component structure.

In an example embodiment of the microstructured component according to the present invention, conductor paths for contacting the component structure and/or at least one electrically conductive shield, to which at least part of the component structure is electrically connected and which prevents electrostatic adhesion of the component structure during the anodic bonding, are integrated into the layered construction. Both the conductor paths and the shields are positioned between the glass layer and the component structure and may be implemented in the form of a structured metallization of the glass layer and/or of the surface of the first silicon wafer on the bonding side.

Both the first silicon wafer, in which the component structure is arranged, and the pre-structured second silicon wafer, which forms the cap, are positioned on the glass layer in such a manner that the conductor paths and shields are contacted by silicon at the points provided for this purpose. In this case, the features of anodic bonding described above in connection with the component structure are also relevant in regard to the cap. A large part of the contact surface may be anodically bonded to the glass layer, while a correspondingly smaller part of the contact surface may extend over the metal layer and is pressed against it.

The component structure of the microstructured component according to an example embodiment of the present invention may be enclosed in an especially good vacuum between the glass layer and the cap with the aid of the present invention. For this purpose, at least one opening is produced in the cap which is only resealed under defined pressure conditions after the cap is bonded to the glass layer. This opening may be generated in the course of the pre-structuring of the second silicon layer or even only after the bonding to the glass layer. This opening is typically produced in the form of an isolation trench, via which sensor structures may be contacted from above through the cap.

In an example embodiment, the electrical connection of the component structure to the outside world is produced via the cap. For this purpose, the cap is bonded to the glass layer in such a manner that it contacts at least one conductor path. In addition, contact pads, which are insulated from the residual silicon of the cap through isolation trenches, are arranged in the cap. These isolation trenches may subsequently be sealed again with vacuum deposition, so that a good vacuum may be easily produced under the cap. The structuring of the contact pads in the cap may be performed through trench etching, starting from the top of the cap bonded to the glass layer, in order to separate a silicon island, the pad, on all sides from the cap silicon and to insulate it. Through the trenches for insulating the contact pads, the inside of the microstructured component is opened, so that there is pressure equalization with the surroundings. The hermetic seal of the component structure may only be produced subsequently through a refill process, in which the trenches are sealed using an electrically insulating material, such as silicon oxide or silicon nitride. These materials are typically deposited in a CVD deposition process at a pressure of 100 µbar to 1 mbar. In this manner, the component structure is enclosed in a vacuum which may be better by up to an order of magnitude than, for example, during the anodic bonding process. The component structure may thus be enclosed in an especially good vacuum through a suitable refill process for sealing openings in the cap.

BRIEF DESCRIPTION OF THE DRAWINGS

FIG. 2 illustrates a wafer arrangement after a bonding procedure.

FIG. 3 illustrates a functional sensor structure and a conductor path bridge made of silicon.

FIG. 4 illustrates a pre-structured silicon wafer over an wafer arrangement.

FIG. 5 illustrates a layered construction of a sensor element.

FIG. 8 illustrates a cross-section through an overall structure of a sensor element according to an example embodiment of the present invention.

DETAILED DESCRIPTION

All FIGS. 1 to 8 are cross-sectional illustrations of the layered construction. It is to be noted at this point that FIGS. 1 to 8 are merely to illustrate one possible variant of the method according to the present invention.

The layered construction of a microstructured component according to the present invention includes a carrier including at least one glass layer. For the sensor element described here, a PYREX™ wafer 1 is used as carrier 1. However, a composite wafer including a bondable glass layer may also be used as a carrier, for example.

Figure 1:
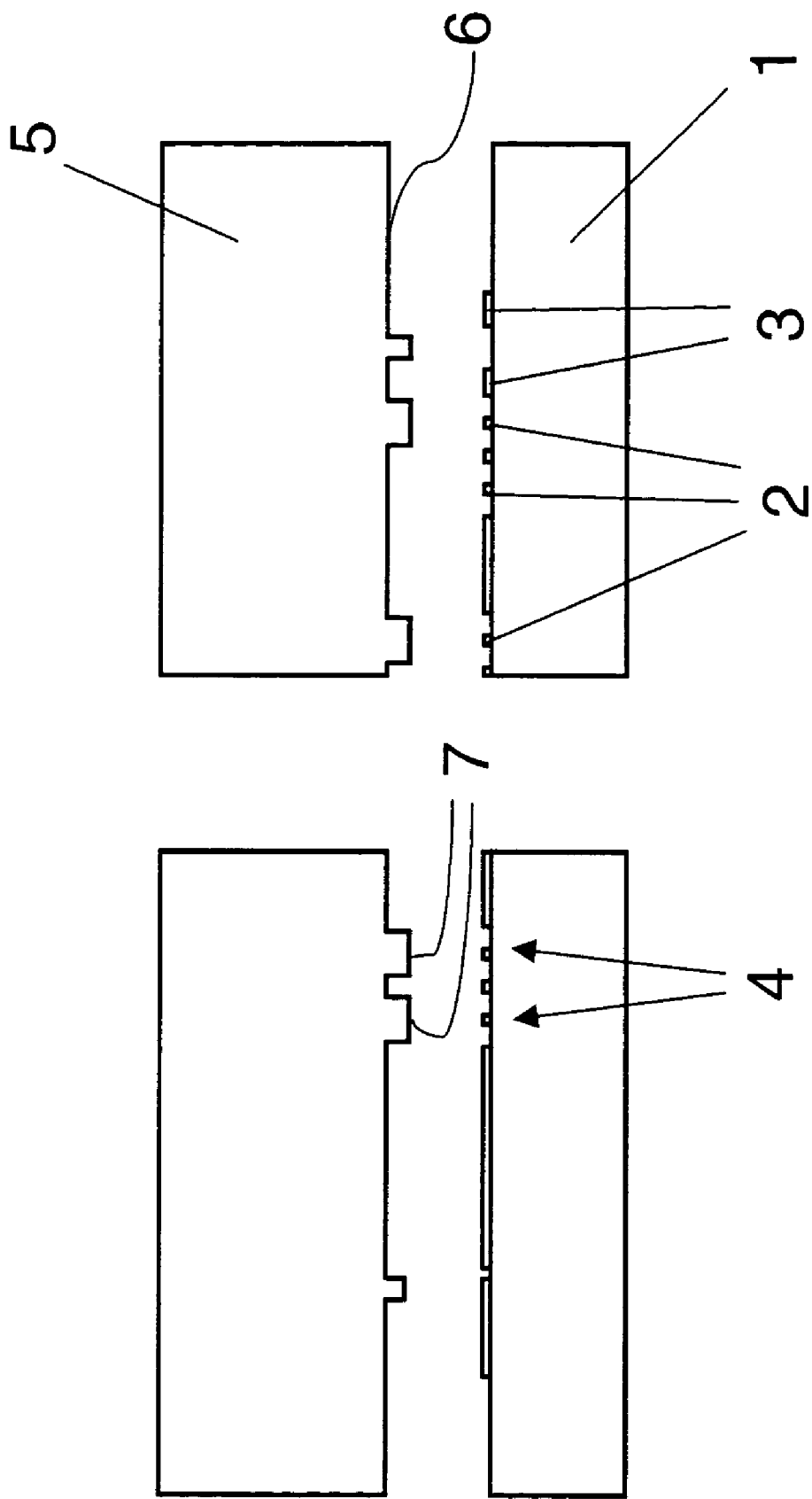
FIG. 1 illustrates a carrier after it has been provided with a metallization.

FIG. 1 illustrates carrier 1 after it has been provided with a metallization. Materials such as aluminum, AlSi, AlSiCu, CrAu, WTi/Au, PtAu, etc. may be selected for this purpose. The metallization was structured, conductor paths 2, for contacting the sensor structure, and shields 3, with the aid of which electrostatic adhesion of the sensor structure to the carrier may be avoided, being produced. In the example embodiment illustrated, the metallization may be removed only in bonding regions 4, i.e., in the regions in which anodic bonding is to be performed later. The metallization is to be made as thick as possible. However, it is not to significantly impair the anodic bonding in its surroundings. Specifically, a defective region of the anodic bonding typically forms in the edge regions of the metallization, whose lateral extent is a function of the thickness of the metallization and/or the topographical elevation on the bonding surface. Suitable values for the thickness of the metallization are between 50 and 200 nm, e.g., 100 nm. The lateral interference zone is typically 10 times this value, i.e., 1 µm, for example.

A silicon wafer 5, in which the actual component structure is to be arranged in the example embodiment described, is positioned opposite carrier 1. Silicon wafer 5 illustrated in FIG. 1 may have its original thickness or may already be thinned to a lower thickness of 200 to 400 µm, for example. In any case, it is to be sufficiently thick that it may still be handled without excessive risk of breaking. Silicon wafer 5 may have a (111)-orientation, since (111)-silicon is isotropic in the wafer plane. This may provide mode equalization of angular rate sensors.

The bonding side of silicon wafer 5 illustrated in FIG. 1, i.e., surface 6 of silicon wafer 5 facing carrier 1, is structured by using trench technology. In this case, entire surface 6 is set back, with the exception of the regions in which a bonding contact to carrier 1 is to be produced, which are thus to form bonding areas 7 of the component structure. Correspondingly, bonding areas 7 extend above surface 6 of silicon wafer 5, which is otherwise set back. The extent of the setback may be up to 50 µm and may be in the range from 5 to 20 µm. In this manner, electrical insulation to the metallization of carrier 1 may be ensured. In addition, freestanding structures may be produced in silicon wafer 5 in the regions of the setback.

Silicon wafer 5 pre-structured in this manner is aligned in relation to carrier 1 and/or its surface provided with the structured metallization and bonded so that bonding areas 7 of silicon wafer 5 come at least partially into contact with anodic bonding regions 4 of carrier 1. In the regions in which ohmic contact of silicon wafer 5 to the metallization of carrier 1 is provided, bonding areas 7 at least partially overlap the metallization. The alignment of silicon wafer 5 may be performed visually, for example, since carrier 1 is transparent in the example embodiment described. A further possibility is the use of infrared alignment techniques. In addition, both carrier 1 and silicon wafer 5 may be provided with alignment structures. The anodic bond between carrier 1 and silicon wafer 5 is produced by heating the wafer arrangement and applying an electrical voltage, the bonding voltage. At the same time, an ohmic contact is also produced in the overlap regions between silicon and metallization, since a eutectic mixture forms in these regions, supported by the mechanical contact pressure of the neighboring anodic bonding. Therefore, shields 3 are at the same electrical potential as silicon wafer 5, so that undesired electrostatic deflection and bonding of silicon wafer 5 to carrier 1 may be practically prevented even in extended freestanding regions. FIG. 2 illustrates the wafer arrangement after the bonding procedure, through which a tight bond has been manufactured between carrier 1 and silicon wafer 5, and after silicon wafer 5 has been thinned to the desired thickness. For this purpose a chemical-mechanical polishing technique (CMP) may be used, for example. For very tall structures, the wafer may also be left in its original thickness. Independently of this, it may be provided to polish the surface of silicon wafer 5 after the bonding process.

Subsequently the entire sensor structure, including immovable and, e.g., also movable structure elements, is produced in silicon wafer 5, for which silicon deep trench technology is used in the example embodiment illustrated. The sensor structure may be aligned to conductor paths 2, bonding regions 4 on carrier 1, and bonding areas 7 of silicon wafer 5. The alignment for this purpose is performed even before the actual trench etching, during the photolithographic structuring of the etching mask in a masking layer applied to silicon wafer 5. If carrier 1 is transparent, the masking layer may be structured through double-sided photolithography. However, infrared alignment may also be used during the photolithographic structuring of the masking layer. The etching attack during deep trenching is performed in the regions of the surface of silicon wafer 5 in which the masking layer has been removed during the photolithographic structuring. In order to prevent an etching attack from the rear by the etching gases used for the plasma trench process, a thin oxide layer may be applied to set-back surface 6 of silicon wafer 5 before bonding, which then is also used as a lower etch stop. Photo-resist, which is structured through exposure and developing, is typically used as a masking layer.

Functional sensor structure 10 is illustrated in the left part of FIG. 3, including a fixed comb electrode 11, including a movable comb electrode 12 connected to an oscillating mass 13, including a Coriolis mass 14, and including two fixed suspension devices 15 for detection electrodes. The right part of FIG. 3 illustrates a conductor path bridge 16 made of silicon, which connects two metal conductor paths 2 to one another and bridges over multiple further functional metal structures 2 to 3 without contact. Conductor path bridges of this type may allow the implementation of conductor path intersections, through which the freedom of structuring in a microstructured component according to the present invention may be significantly increased.

In FIG. 4, a pre-structured silicon wafer 20, referred to in the following as cap wafer or cap 20, is illustrated over the wafer arrangement described above. A cavity 21 for sensor structure 10, conductor path bridge 16, and fixed comb electrodes 11 is arranged in cap wafer 20, so that the individual structure elements of the sensor structure, e.g., the movable structure elements of sensor structure 10, may fulfill their respective functions unhindered. The depth of cavity 21 may be selected so that cap 20 functions as a mechanical stop for the movable structure elements and therefore as an overload protector. The vertical distance between the inner bottom of the cap and the top of the sensor structure is typically between 1 μm and half of the height of the sensor structure. Cavity 21 may, for example, be introduced into cap wafer 20 through a time-controlled etching process in trench technology, the process duration determining the depth of cavity 21. Cap wafer 20 illustrated in FIG. 4 also has pre-structuring in the form of a stamp-like formation 22 in the region of a contact pad to be produced. Via this, the electrical contact to a conductor path 2 is to be produced after the bonding of cap wafer 20 to carrier 1 and thus an electrical connection of sensor structure 10 and/or parts of sensor structure 10 and/or parts of the shielding in the form of the shields. It may be seen in the right part of FIG. 4 that the right edge of cavity 21 overlaps a shield 3, i.e., it is bonded to this shield 3 during the anodic bonding of cap wafer 20 to carrier 1. It may be provided for this bonding procedure that all metallized regions of the carrier surface to be electrically connected are in direct contact to the silicon of the cap wafer 20, so that a shield effect is achieved during the anodic bonding, i.e., the anodic bonding process may function without faults due to adhesion and/or electrostatic attraction.

FIG. 5 illustrates the layered construction of the sensor element described after the bonding of cap wafer 20 to carrier 1. Since all metallized regions of the carrier surface, i.e., all conductor paths 2 and shields 3, are connected to sensor structure 10 and to the silicon of cap wafer 20, so that all parts of sensor structure 10 and all parts under sensor structure 10 are at the electrical potential of cap wafer 20, no electrostatic collapse of sensor structure 10 downward or toward cap 20 may occur even during the second anodic bonding process.

Thinning may also be provided in the case of cap wafer 20, which may be performed either before or after the pre-structuring or even after the second bonding process. Cap 20 is to have a thickness of 50 to 300 μm when contact pads 23 have been exposed and electrically insulated by isolation trenches 24 in cap 20. The gas chamber under cap 20 is opened again via isolation trenches 24, so that pressure equalization with the surroundings occurs. Accordingly, the pressure ratios during bonding of cap wafer 20 to carrier 1 are unimportant for the pressure which exists inside the sensor after the sensor element is finished.

In order to protect cavity 21 of cap wafer 20 from an etching attack during the production of isolation trenches 24, it may be provided with a thin passivating layer before the bonding. Through suitable spacing of isolation trenches 24 from active structure elements of sensor structure 10 or placement of silicon isolation structures between active structure elements and isolation trenches, as illustrated in the left part of FIG. 5, an undesired etching attack on the active structure elements may also be prevented from occurring.

Figure 6:
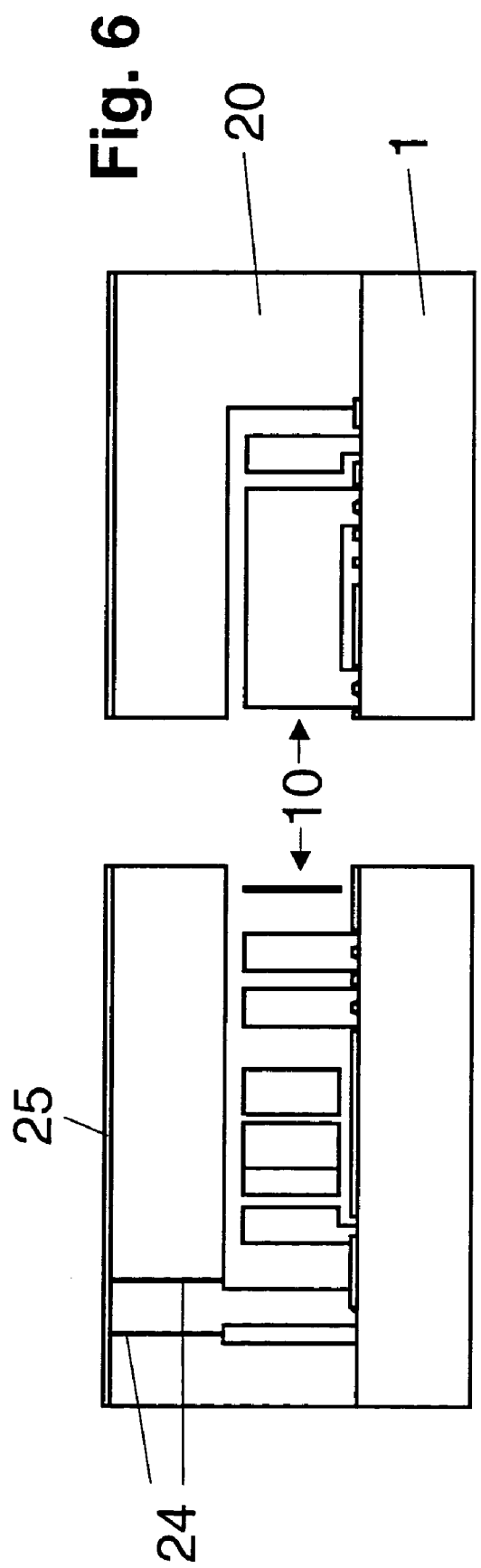
FIG. 6 illustrates a layered construction after a refill process.

Isolation trenches 24 are sealed using an electrically insulating material. The inside of the sensor is finally sealed only by this refill process. Materials which may be deposited in a CVD (chemical vapor deposition) process, such as silicon oxide or silicon nitride, may be used to seal isolation trenches 24. Since such CVD processes are able to be performed at very low pressures, e.g., in the starting phase, an extremely low vacuum may easily be enclosed under cap 20 in this manner, which may provide an effect on the later sensor operation. FIG. 6 illustrates the layered construction after the refill process, in which a layer 25 made of refill material has also been produced on the surface of cap wafer 20.

Figure 7:
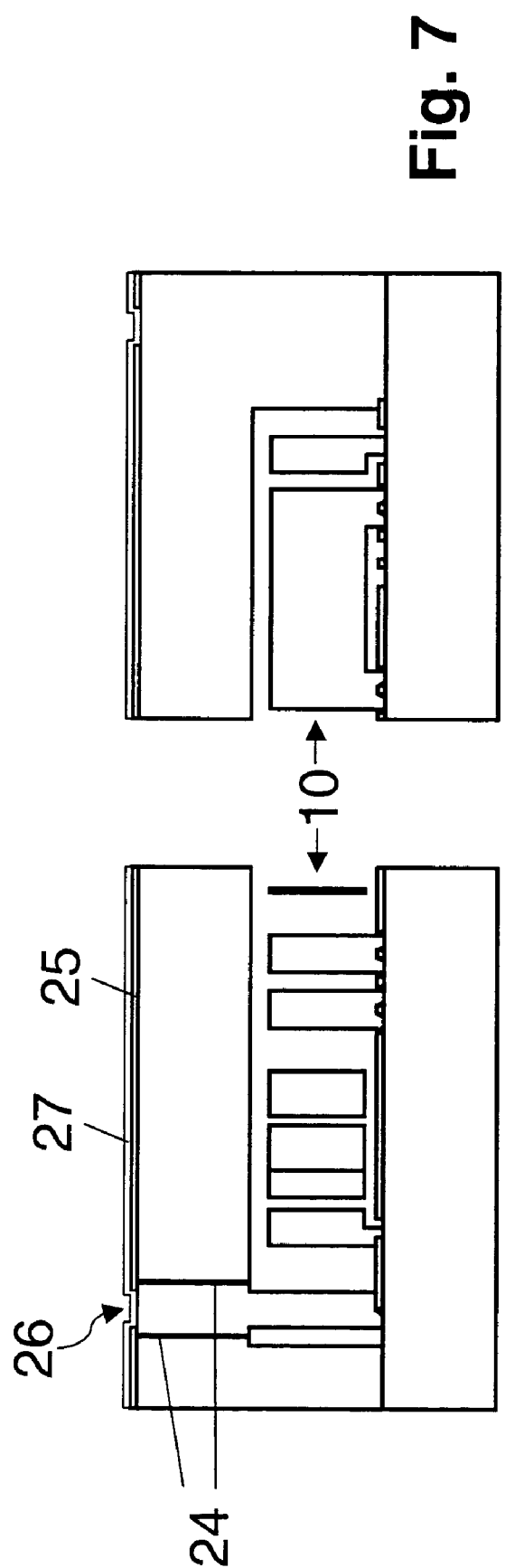
FIG. 7 illustrates a layered construction after contact holes have been opened in layer via contact pads and a metallization layer has been produced over the entire surface.

FIG. 7 illustrates the layered construction after contact holes 26 have been opened in layer 25 via contact pads 23 and a metallization layer 27 has been produced over the entire surface. Al, AlSi, AlSiCu, etc. may be applied for this purpose, for example. This metallization layer 27 may then be structured in any desired manner, either directly into contact pads or into conductor paths leading to contact pads or contact areas which are further away.

In the example embodiment described, metallization layer 27 is structured into metallic contact areas 28 above contact pads 24, which is illustrated in FIG. 8. After the isolation and suitable construction of the sensor elements thus obtained on lead frames, these contact pads 24 are used for bonding the connection wires during wire bonding or for flip-chip mounting directly on a ceramic hybrid.

FIG. 8 illustrates the cross-section through the overall structure of a sensor element according to an example embodiment of the present invention. The layered construction of this sensor element includes a PYREX™ wafer as a carrier 1, onto which a sensor metallization plane is applied. The layered construction also includes a sensor structure 10 made of a thick single-crystal silicon layer having the features described above in regard to improved sensor performance. Finally, the layered construction also includes a silicon cap structure 20 including contact pads 23, and possibly conductor paths and metallic contact areas, which are insulated from the remaining cap structure 20 by sealed isolation trenches 24. Cap 20 has also been bonded to carrier 1 through further anodic bonding, without additional adhesive layers. Carrier 1 is thus used both for fixing sensor structure 10 and for the hermetic connection of cap 20. Through a suitable refill process for sealing isolation trenches 24, an especially good vacuum may be enclosed in the inside of the sensor. Both conductor paths 2 for contacting sensor structure 10 and shields 3 at all points at which no metal conductor paths 2 extend under sensor structure 10 may also be seen. Furthermore, the terminals of metal conductor paths 2 and shields 3 may be seen at the cap silicon. At these points, the silicon is partially in contact with PYREX™ and partially with metal, so that both anodic bonding to PYREX™ and eutectic bonding to the metal occurs.

It is also to be noted here that modifications of the process sequence described above are also within the scope of the present invention. Thus, for example, alternatively or additionally to silicon wafer 5, in which sensor structure 10 is formed, carrier 1 may also be pre-structured before silicon wafer 5 is bonded to carrier 1. Conductor paths 2 may then also be guided in depressions of the carrier surface. The corresponding terminal regions in the silicon surface may be raised by setting back the remaining silicon surface through etching, for example. The preceding description of the through contacts in cap wafer 20 is also to be understood as merely exemplary. Thus, for example, isolation trenches 24 may also be laid from the bonding side before the bonding, through a time-controlled etching step to a specific target depth, for example. The actual separation of terminal pads 23 from the surrounding cap silicon is then performed through back-etching of the entire surface of cap wafer 20 after the bonding process, i.e., starting from the diametrically opposite surface.

An example embodiment of the present invention may provide for:
- simple, reliable and cost-effective manufacturing method,
- one single carrier and/or one single carrier layer is sufficient for both fixing and electrical contacting of the sensor structure and for the hermetic connection of the cap,
- the sensor structure may be enclosed in a very good vacuum,
- implementation of tall sensor structures, and thus good mode separation between in-plane and out-of-plane degrees of freedom, reduced square area as a result of this,
- high basic capacitance C, therefore large capacitance variations AC, and reduced electrical noise as a result of this,
- increased sensor mass, therefore reduced mechanical noise,
- low-resistance contact and connection of the sensor substructures to the outside world through metallic conductor paths,
- smaller parasitic capacitances due to guiding the conductor paths on PYREX™ wafer and/or PYREX™ layer
- integrated ESD shield, therefore lower-noise sensor operation,
- more robust sensor construction which is more resistant to overload including integrated z-stops in both directions, and/or
- single crystal silicon having especially high mechanical qualities, e.g., higher quality, resistant to continuous load, low stress, highly conductive, free of stress gradients, etc.

LIST OF REFERENCE NUMBERS 1 carrier
2 conductor path
3 shield
4 bonding region (on carrier)
5 first silicon wafer
6 bonding side/surface (first silicon wafer)
7 bonding area (first silicon wafer)
10 component structure/sensor structure
11 fixed comb electrode
12 movable comb electrode
13 oscillating mass
14 Coriolis mass
15 suspension device for detection electrode
16 conductor path bridge
20 second silicon wafer/cap wafer/cap
21 cavity
22 stamp-like formation
23 contact pad
24 isolation trench
25 layer (refill material)
26 contact hole
27 metallization layer
28 contact area

What is claimed is:

1. A microstructured component having a layered construction, comprising:
a carrier including at least one glass layer;
a component structure including a first silicon layer directly bonded to the glass layer, the component structure including movable structure elements; and
a cap arranged over the component structure and bonded directly to the glass layer, wherein the component structure includes a first silicon wafer and is bonded to the glass layer by anodic bonding at a temperature of approximately 400° C., wherein the first silicon layer has a thickness greater than 50 μm, wherein the cap is configured as a mechanical stop for the movable structure elements, wherein the component structure is enclosed in a vacuum between the glass layer and the cap, and wherein a pressure of the vacuum is approximately 100 μbar to 1 mbar.

2. The microstructured component of claim 1, wherein the first silicon wafer includes a (111)-silicon wafer.

3. The microstructured component of claim 1, wherein the cap includes a second silicon wafer and is bonded to the glass layer by anodic bonding.

4. The microstructured component of claim 1, further comprising conductor paths arranged to contact the component structure arranged between the glass layer and the component structure.

5. The microstructured component of claim 1, further comprising at least one electrically conductive shield arranged on the glass layer, at least part of the component structure electrically connected to the shield.

6. The microstructured component of claim 5, wherein the glass layer includes a structured metallization in which conductor paths and shields are arranged.

7. The microstructured component of claim 1, wherein the microstructured component is a yaw rate sensor.

* * * * *